(12) United States Patent
Qin

(10) Patent No.: US 10,581,026 B2
(45) Date of Patent: Mar. 3, 2020

(54) MANUFACTURE METHOD OF FLEXIBLE DISPLAY PANEL

(71) Applicant: Wuhan China Star Optoelectronics Technology Co., Ltd., Wuhan (CN)

(72) Inventor: Fang Qin, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 362 days.

(21) Appl. No.: 15/505,099

(22) PCT Filed: Dec. 29, 2016

(86) PCT No.: PCT/CN2016/113057
§ 371 (c)(1),
(2) Date: Feb. 20, 2017

(87) PCT Pub. No.: WO2018/113020
PCT Pub. Date: Jun. 28, 2018

(65) Prior Publication Data
US 2019/0157623 A1 May 23, 2019

(30) Foreign Application Priority Data
Dec. 20, 2016 (CN) .......................... 2016 1 1184973

(51) Int. Cl.
*H01L 51/56* (2006.01)
*G09F 9/30* (2006.01)
(Continued)

(52) U.S. Cl.
CPC .............. *H01L 51/56* (2013.01); *G09F 9/301* (2013.01); *H01L 27/32* (2013.01); *H01L 51/003* (2013.01);
(Continued)

(58) Field of Classification Search
CPC .................................. H01L 51/56; G09F 9/301
(Continued)

(56) References Cited

U.S. PATENT DOCUMENTS

2010/0025666 A1* 2/2010 Hakii ...................... B82Y 10/00
257/40
2015/0255522 A1* 9/2015 Sato .................... H01L 27/3244
257/88
2017/0317301 A1* 11/2017 Xie .......................... H01L 21/77

FOREIGN PATENT DOCUMENTS

CN           106057864 A           10/2016
CN           106229421 A           12/2016

* cited by examiner

*Primary Examiner* — Bo Fan
(74) *Attorney, Agent, or Firm* — Leong C. Lei

(57) ABSTRACT

The present invention provides a manufacture method of a flexible display panel, and after forming grooves on the rigid substrate, and forming the flexible supporting bases in the grooves, and manufacturing the display element layer on the flexible supporting bases and the rigid substrate, the flexible display mother board is obtained. Then, the normal knife flywheel is used to cut the flexible display mother board along the edges of the grooves to obtain the flexible substrate units. After stripping the rigid substrates in the flexible substrate units with laser, the flexible display substrates are obtained. The method saves the purchase cost of the laser cutting apparatus, and thus to reduce the manufacture cost of the flexible display substrate, and meanwhile, to raise the cutting yield of cutting the flexible display mother board with the normal knife flywheel for promoting the usage lifetime of the knife flywheel.

9 Claims, 3 Drawing Sheets

(51) Int. Cl.
*H01L 51/00* (2006.01)
*H01L 27/32* (2006.01)

(52) U.S. Cl.
CPC .... *H01L 51/0097* (2013.01); *H01L 2227/323* (2013.01); *H01L 2227/326* (2013.01); *H01L 2251/566* (2013.01)

(58) Field of Classification Search
USPC ........................................ 438/99; 257/40, 88
See application file for complete search history.

MANUFACTURE METHOD OF FLEXIBLE DISPLAY PANEL

FIELD OF THE INVENTION

The present invention relates to a display technology field, and more particularly to a manufacture method of a flexible display panel.

BACKGROUND OF THE INVENTION

The Organic Light Emitting Display (OLED) device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

The OLED display element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, the Indium Tin Oxide (ITO) electrode and the metal electrode are respectively employed as the anode and the cathode of the Display. Under certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

The flat panel display and lighting field on the basis of OLED has been widely concerned by scientific research and academic circle in the recent years. Particularly in these few years, the flexible OLED display panel with big future has already been risen in the world, and become the competition focus of all the panel makers.

The main stream manufacture method of the flexible OLED display panel is: the glass substrate is used to be the carrier, and a layer of polyimide (PI) film is coated on the entire surface of the glass substrate, and then the PI film is cured, and the PI film serves as the flexible substrate. Then, the thin film transistor layer, the OLED element layer and the Thin Film Encapsulation layer are manufactured in order upward from the PI film. Thus, the flexible OLED display mother board is obtained. By cutting the flexible OLED display mother board, the respective flexible OLED display panels are manufactured. Because there is an entire PI film adhered on the glass substrate, it is difficult to cut with the normal knife flywheel. As using the normal knife flywheel to implement cutting, it is easy to have the issues of low cutting yield and short knife flywheel usage period. Therefore, it is required to purchase the expensive laser cutting apparatus for cutting the flexible display mother board. After cutting, the PI film and the glass substrate are separated with the Laser lift off (LLO) machine to obtain the flexible display panel. However, the price of the laser cutting apparatus in the aforesaid process is high and the energy equality needs to be strictly controlled, and then the manufacture cost is increased.

SUMMARY OF THE INVENTION

An objective of the present invention is to provide a manufacture method of a flexible display substrate, which can save the purchase cost of the laser cutting apparatus, and thus to reduce the manufacture cost of the flexible display substrate, and meanwhile, to raise the cutting yield of cutting the flexible display mother board with a normal knife flywheel for promoting the usage lifetime of the knife flywheel cutting the flexible display mother board.

For realizing the aforesaid objectives, the present invention provides a manufacture method of a flexible display substrate, comprising steps of:

step 1, providing a rigid substrate, and forming a plurality of grooves which are separately located on the rigid substrate;

step 2, respectively forming a plurality of flexible supporting bases in the plurality of grooves;

step 3, manufacturing a display element layer on the rigid substrate and the flexible supporting bases to obtain a flexible display mother board;

step 4, cutting the flexible display mother board along edges of the plurality of grooves to obtain a plurality of flexible substrate units, and the flexible substrate unit comprising the rigid substrate, the flexible supporting base and the display element layer from bottom to top in order;

step 5, stripping the flexible supporting bases in the flexible substrate units from the rigid substrate to obtain a plurality of flexible display panels, and the flexible display panel comprising the flexible supporting base and the display element layer located on the flexible supporting base.

The rigid substrate is a glass substrate.

In step 1, a physical method or a chemical method is used to form the plurality of grooves which are separately located on the rigid substrate.

In step 2, a manufacture method of the flexible supporting bases is: respectively coating an organic material in the plurality of grooves, and forming the plurality of flexible supporting bases after curing the organic material.

A material of the flexible supporting base is polyimide.

In step 2, upper surfaces of the flexible supporting bases and upper surfaces of areas among the plurality of grooves on the rigid substrate are even.

In step 4, a knife flywheel is used to cut the flexible display mother board.

The display element layer comprises an OLED element.

In step 5, a laser is used to irradiate the flexible substrate unit from one side of the rigid substrate to separate the flexible supporting base in the flexible substrate unit from the rigid substrate, and thus to strip the flexible supporting base from the rigid substrate.

The present invention further provides a manufacture method of a flexible display panel, comprising steps of:

step 1, providing a rigid substrate, and forming a plurality of grooves which are separately located on the rigid substrate;

step 2, respectively forming a plurality of flexible supporting bases in the plurality of grooves;

step 3, manufacturing a display element layer on the rigid substrate and the flexible supporting bases to obtain a flexible display mother board;

step 4, cutting the flexible display mother board along edges of the plurality of grooves to obtain a plurality of flexible substrate units, and the flexible substrate unit comprising the rigid substrate, the flexible supporting base and the display element layer from bottom to top in order;

step 5, stripping the flexible supporting bases in the flexible substrate units from the rigid substrate to obtain a plurality of flexible display panels, and the flexible display panel comprising the flexible supporting base and the display element layer located on the flexible supporting base;

wherein the rigid substrate is a glass substrate;

in step 1, a physical method or a chemical method is used to form the plurality of grooves which are separately located on the rigid substrate.

The benefits of the present invention are: the present invention provides a manufacture method of a flexible display panel, and after forming grooves on the rigid substrate, and forming the flexible supporting bases in the grooves, and manufacturing the display element layer on the flexible supporting bases and the rigid substrate, the flexible display mother board is obtained. Then, the normal knife flywheel is used to cut the flexible display mother board along the edges of the grooves to obtain the flexible substrate units. After stripping the rigid substrates in the flexible substrate units with laser, the flexible display substrates are obtained. The method saves the purchase cost of the laser cutting apparatus, and thus to reduce the manufacture cost of the flexible display substrate, and meanwhile, to raise the cutting yield of cutting the flexible display mother board with the normal knife flywheel for promoting the usage lifetime of the knife flywheel cutting the flexible display mother board. Besides, the usage amount of the organic material for manufacturing the flexible supporting bases is also decreased to reduce the production cost in advance.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
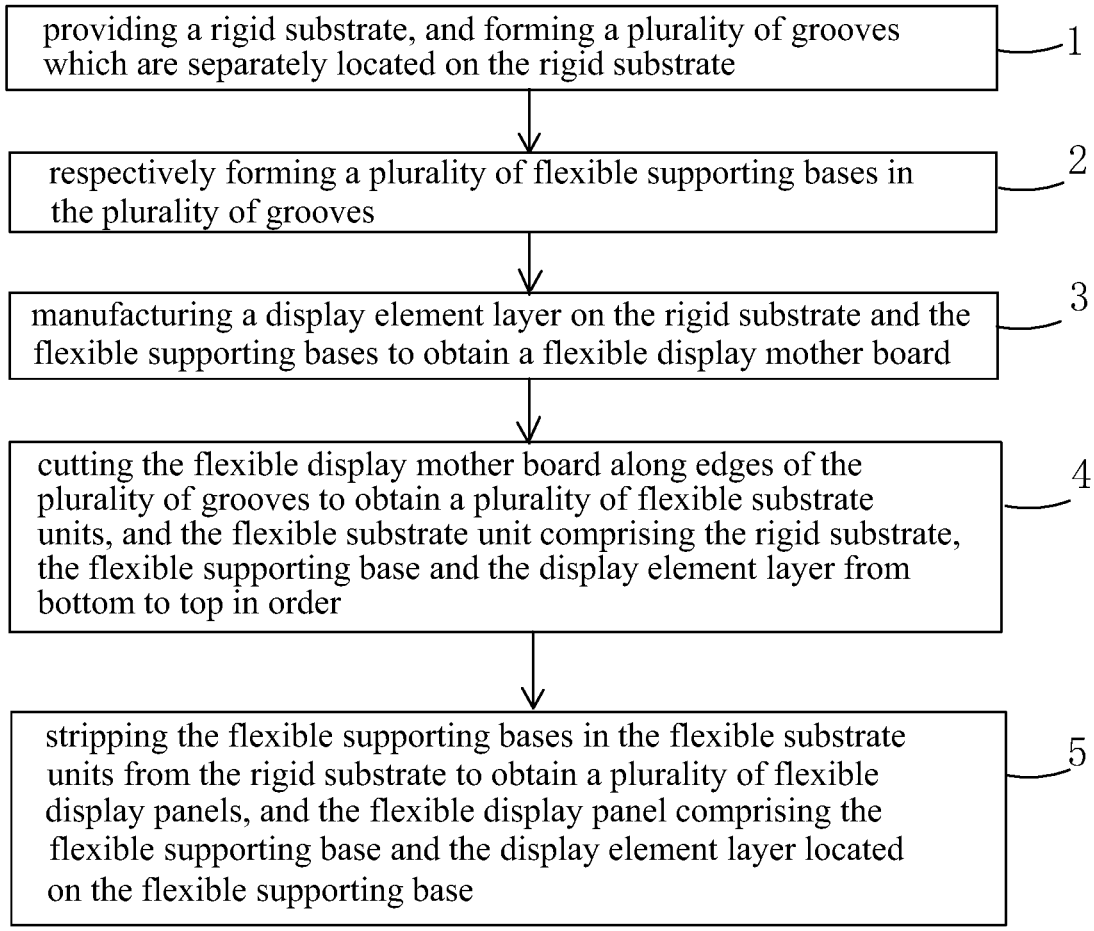
FIG. 1 is a flowchart of a manufacture method of a flexible substrate of the present invention.
Figure 2:
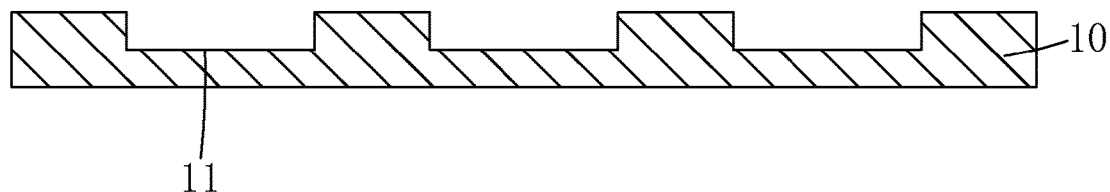
FIG. 2 is a diagram of step 1 of a manufacture method of a flexible substrate of the present invention.

Please refer to FIG. 1. The present invention provides a manufacture method of a flexible substrate, comprising steps of:

step 1, as shown in FIG. 2, providing a rigid substrate 10, and forming a plurality of grooves 11 which are separately located on the rigid substrate 10.

Specifically, the rigid substrate 10 is a glass substrate.

Figure 3:
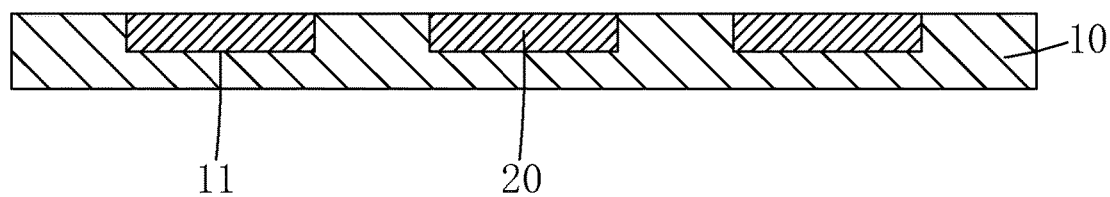
FIG. 3 is a diagram of step 2 of a manufacture method of a flexible substrate of the present invention.

Specifically, in step 1, a physical method or a chemical method is used to form the plurality of grooves which are separately located on the rigid substrate 10.

step 2, as shown in FIG. 3, respectively forming a plurality of flexible supporting bases 20 in the plurality of grooves 11.

Specifically, in step 2, a manufacture method of the flexible supporting bases 20 is: respectively coating an organic material in the plurality of grooves 11, and forming the plurality of flexible supporting bases 20 after curing the organic material.

Preferably, the material of the flexible supporting bases 20 is polyimide (PI).

Figure 4:
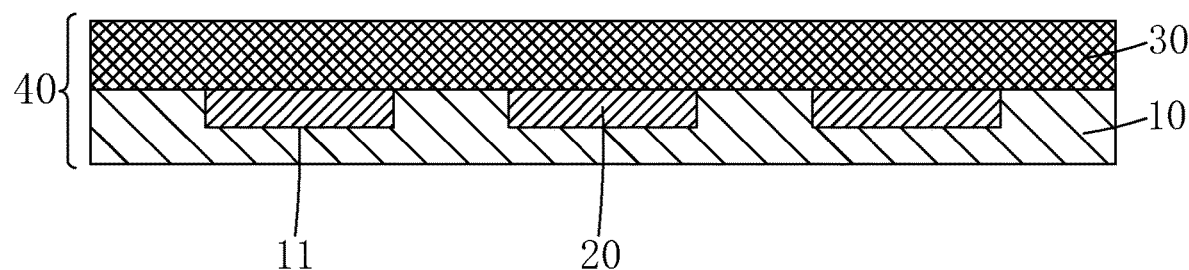
FIG. 4 is a diagram of step 3 of a manufacture method of a flexible substrate of the present invention.

Preferably, upper surfaces of the flexible supporting bases 20 and upper surfaces of areas among the plurality of grooves 11 on the rigid substrate 10 are even.

step 3, as shown in FIG. 4, manufacturing a display element layer 30 on the rigid substrate 10 and the flexible supporting bases 20 to obtain a flexible display mother board 40.

Figure 5:
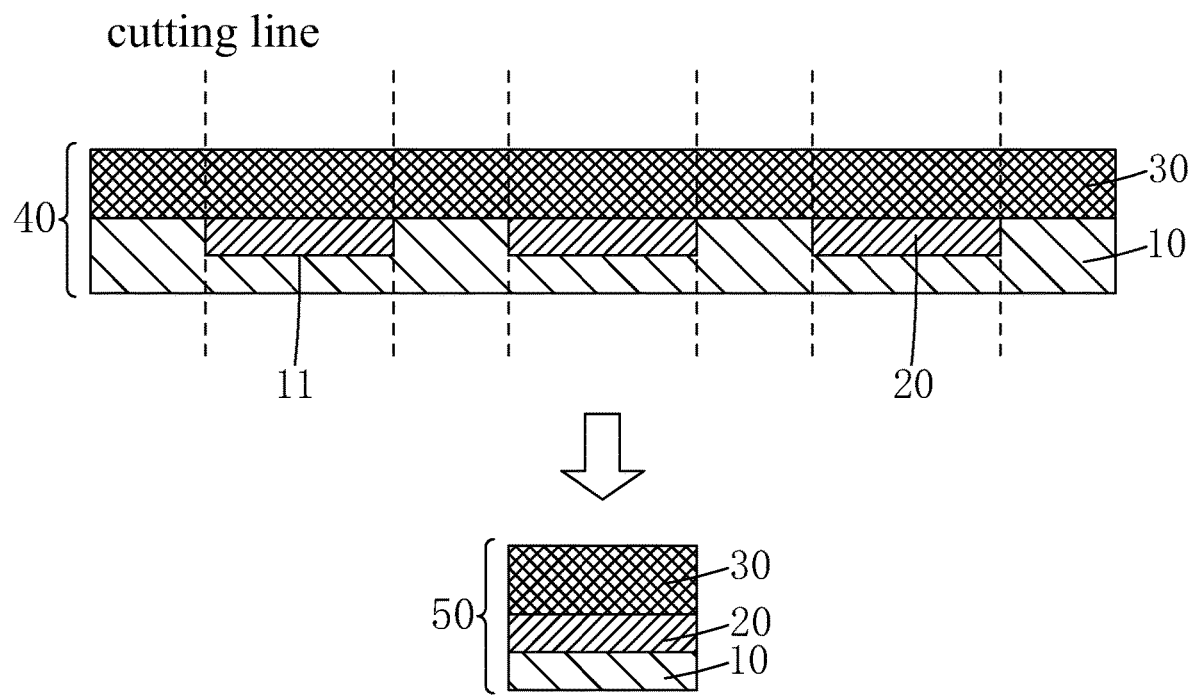
FIG. 5 is a diagram of step 4 of a manufacture method of a flexible substrate of the present invention.

Specifically, the display element layer 30 comprises an OLED element.

step 4, as shown in FIG. 5, cutting the flexible display mother board 40 along edges of the plurality of grooves 11 to obtain a plurality of flexible substrate units 50, and the flexible substrate unit 50 comprising the rigid substrate 10, the flexible supporting base 20 and the display element layer 30 from bottom to top in order.

Specifically, in step 4, a knife flywheel is used to cut the flexible display mother board 40.

Figure 6:
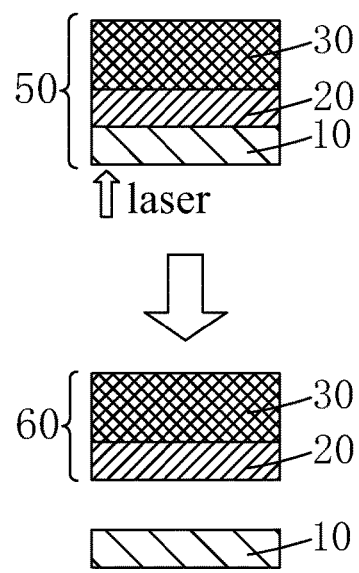
FIG. 6 is a diagram of step 5 of a manufacture method of a flexible substrate of the present invention.

Specifically, in step 4 of the present invention, because the cutting positions of the flexible display mother board 40 do not comprise the flexible supporting base 20. Thus, a normal knife flywheel is enough for cutting the flexible display mother board 40. The higher cutting yield can be obtained and meanwhile, the usage lifetime of the knife flywheel can be promoted.

step 5, as shown in FIG. 6, stripping the flexible supporting bases 50 in the flexible substrate units 20 from the rigid substrate 10 to obtain a plurality of flexible display panels 60, and the flexible display panel 60 comprising the flexible supporting base 20 and the display element layer 30 located on the flexible supporting base 20.

Specifically, in step 5, a laser is used to irradiate the flexible substrate unit 50 from one side of the rigid substrate 10 to separate the flexible supporting base 20 in the flexible substrate unit 50 from the rigid substrate 10, and thus to strip the flexible supporting base 20 from the rigid substrate 10.

In conclusion, the present invention provides a manufacture method of a flexible display panel, and after forming grooves on the rigid substrate, and forming the flexible supporting bases in the grooves, and manufacturing the display element layer on the flexible supporting bases and the rigid substrate, the flexible display mother board is obtained. Then, the normal knife flywheel is used to cut the flexible display mother board along the edges of the grooves to obtain the flexible substrate units. After stripping the rigid substrates in the flexible substrate units with laser, the flexible display substrates are obtained. The method saves the purchase cost of the laser cutting apparatus, and thus to reduce the manufacture cost of the flexible display substrate, and meanwhile, to raise the cutting yield of cutting the flexible display mother board with the normal knife flywheel for promoting the usage lifetime of the knife flywheel cutting the flexible display mother board. Besides, the usage amount of the organic material for manufacturing the flexible supporting bases is also decreased to reduce the production cost in advance.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a flexible display panel, comprising steps of:
    step 1, providing a rigid substrate, and forming a plurality of grooves which are separately located on the rigid substrate;
    step 2, respectively forming a plurality of flexible supporting bases in the plurality of grooves;
    step 3, manufacturing a display element layer on the rigid substrate and the flexible supporting bases to obtain a flexible display mother board;
    step 4, cutting the flexible display mother board along edges of the plurality of grooves at the same time to obtain a plurality of flexible substrate units, and each of the flexible substrate units comprising the rigid substrate, the flexible supporting base and the display element layer from bottom to top in order;
    step 5, stripping the flexible supporting bases in the flexible substrate units from the rigid substrate to obtain a plurality of flexible display panels, and the flexible display panel comprising the flexible supporting base and the display element layer located on the flexible supporting base.

2. The manufacture method of the flexible display panel according to claim 1, wherein the rigid substrate is a glass substrate.

3. The manufacture method of the flexible display panel according to claim 1, wherein in step 1, a physical method or a chemical method is used to form the plurality of grooves which are separately located on the rigid substrate.

4. The manufacture method of the flexible display panel according to claim 1, wherein in step 2, a manufacture method of the flexible supporting bases is: respectively coating an organic material in the plurality of grooves, and forming the plurality of flexible supporting bases after curing the organic material.

5. The manufacture method of the flexible display panel according to claim 1, wherein a material of the flexible supporting base is polyimide.

6. The manufacture method of the flexible display panel according to claim 1, wherein in step 2, upper surfaces of the flexible supporting bases and upper surfaces of areas of the rigid substrate among the flexible supporting bases are aligned with no difference in height.

7. The manufacture method of the flexible display panel according to claim 1, wherein in step 4, a knife flywheel is used to cut the flexible display mother board.

8. The manufacture method of the flexible display panel according to claim 1, wherein the display element layer comprises an OLED element.

9. The manufacture method of the flexible display panel according to claim 1, wherein in step 5, a laser is used to irradiate the flexible substrate unit from one side of the rigid substrate to separate the flexible supporting base in the flexible substrate unit from the rigid substrate.

* * * * *